United States Patent [19]

Graver

[11] Patent Number: 4,595,945
[45] Date of Patent: Jun. 17, 1986

[54] PLASTIC PACKAGE WITH LEAD FRAME CROSSUNDER

[75] Inventor: Ronald N. Graver, Allentown, Pa.

[73] Assignee: AT&T Bell Laboratories, Murray Hill, N.J.

[21] Appl. No.: 544,420

[22] Filed: Oct. 21, 1983

[51] Int. Cl.⁴ .................... H01L 23/48; H01L 23/10
[52] U.S. Cl. ..................................... 357/70; 357/80; 357/72; 357/68
[58] Field of Search .................. 357/70, 80, 74, 68, 357/72

[56] References Cited

U.S. PATENT DOCUMENTS

| | | | |
|---|---|---|---|
| 3,374,537 | 3/1968 | Doelp, Jr. | 357/70 |
| 3,480,836 | 11/1969 | Aronstein | 357/80 |
| 3,942,245 | 3/1976 | Jackson et al. | 357/70 |
| 3,967,296 | 6/1976 | Intrator | 357/80 |
| 4,454,529 | 6/1984 | Philofsky et al. | 357/70 |

Primary Examiner—Andrew J. James
Assistant Examiner—Sheila V. Clark
Attorney, Agent, or Firm—Peter V. D. Wilde

[57] ABSTRACT

Proposed is a new way to distribute power off chip using a specially designed lead frame. The support paddle of the lead frame is split electrically and provides at least two conductor members that are arranged to cross under the chip after the chip is bonded to the paddle. Power and/or ground can be distributed to two or more edges of the chip by providing bonding sites at or near the extremities of the crossunders. The chip itself is electrically isolated from the crossunder members.

3 Claims, 3 Drawing Figures

PLASTIC PACKAGE WITH LEAD FRAME CROSSUNDER

BACKGROUND OF THE INVENTION

Integrated circuit chips have grown in size and packing density to meet user demands for more functions and greater storage capacity at lower cost. With this development, advantages in distributing power to the chip become important.

A common approach is to incorporate a power distribution network into the chip itself. However the power busses tend to be large and the chip size must be increased to accommodate them. Aside from the usual cost disadvantage an increase in the size of a chip that is already comparatively large may require an expensive, or non-standard, package design. Correct use of these tradeoffs is becoming a vital ingredient in the ability of a manufacturer to produce cost competitive advanced memory devices.

An alternative is to distribute the power off chip and introduce power (and ground) at more than one bonding site on the chip. However each new bonding site consumes a pin and it is desirable to avoid multiple pins for power and ground connections.

STATEMENT OF THE INVENTION

I have discovered a way to distribute power off chip using a specially designed lead frame. The support paddle of the lead frame is split electrically and provides at least two conductor members that are arranged to cross under the chip after the chip is bonded to the paddle. Power and/or ground can be distributed to two or more edges of the chip by providing bonding sites at or near the extremities of the crossunders. The chip itself is electrically isolated from the crossunder members.

DETAILED DESCRIPTION

Figure 1:
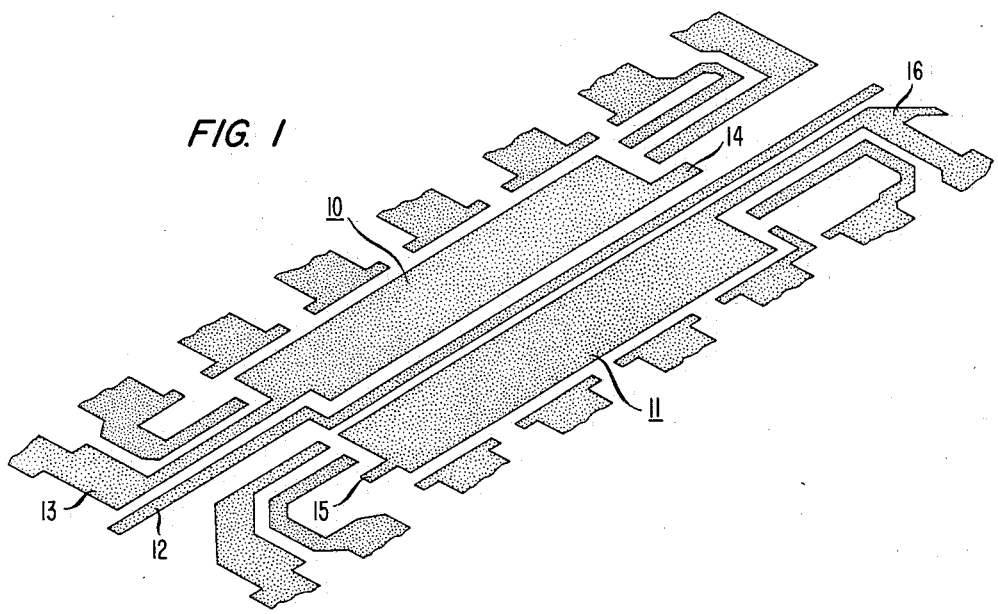
FIG. 1 is a perspective view of a lead frame designed in accordance with one aspect of the invention.

A lead frame designed with power and ground plane crossunders is shown in FIG. 1. A standard pin-out arrangement is used except that the chip support, commonly termed the "paddle", is split into two sections 10 and 11 designed to cross under the chip when the chip is bonded to the paddle. Bonding sites 13, 14 for crossunder 10; 15, 16 for crossunder 11 are provided as shown. The arrangement illustrated in FIG. 1 is one of a variety of crossunder configurations that will occur to the package designer. Bonding sites can be provided at the edges as well as, or instead of, the ends of the package.

Figure 2:
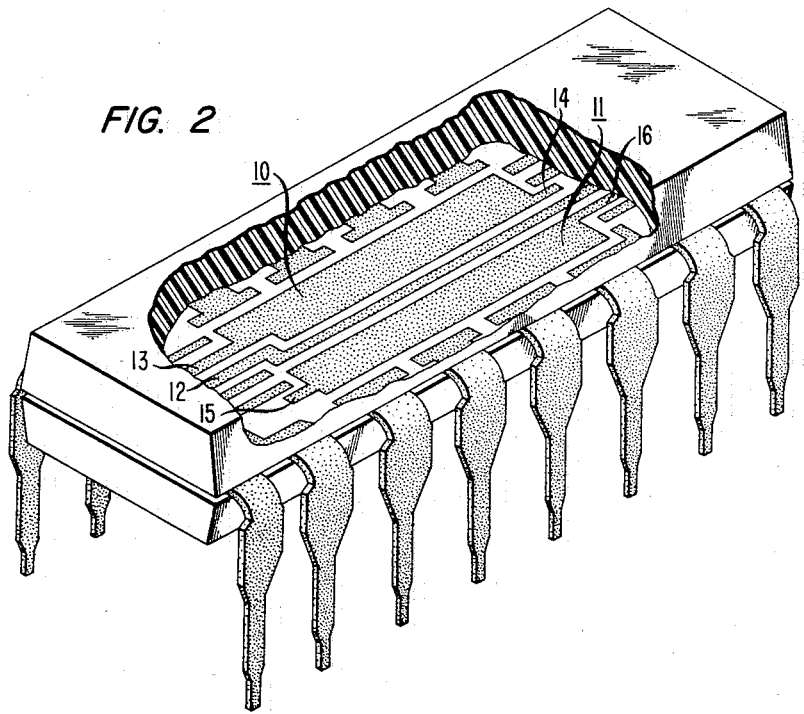
FIG. 2 is a perspective view partly cut away of the lead frame encapsulated in a dual-in-line package.

FIG. 2 shows the lead frame, molded into a standard dual-in-line package. For clarity the assembly is shown without the chip.

Figure 3:
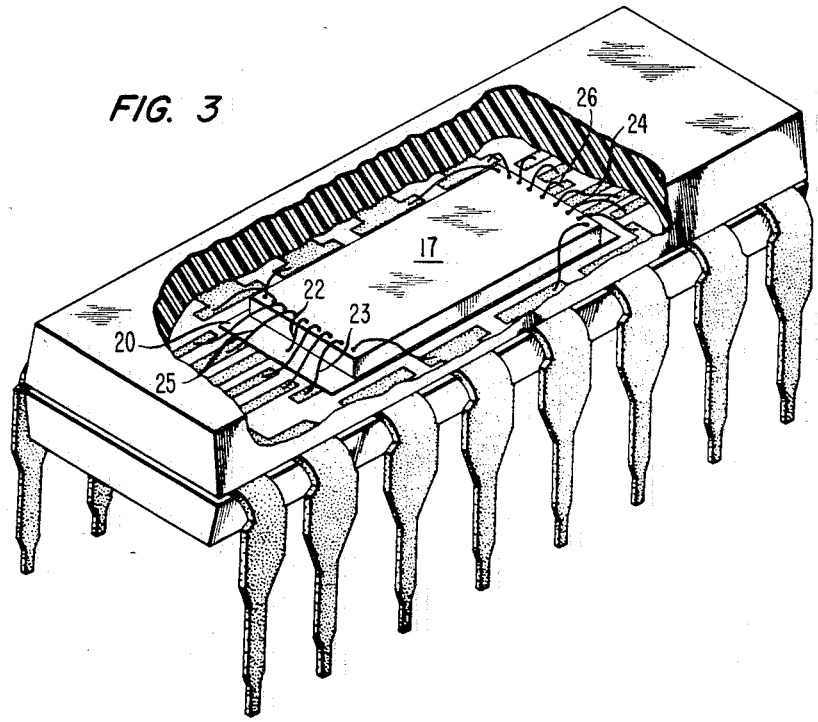
FIG. 3 is a view similar to FIG. 2 showing a chip installed.

FIG. 3 shows the assembly with the chip 17 bonded in place. Interposed between the chip and the paddle is a Kapton film 20 with a conductive layer on the upper side. The Kapton film provides electrical isolation for the sections of the paddle while the metal clad side is the conventional back plane contact for the chip. The wire bonds are shown in FIG. 3. Wire 22 is the connection for the back plane. Wires 23 and 24 are the power connections from the power pads on opposite sides of the chip to paddle 11 and power pin $V_{DD}$. Wires 25 and 26 are ground connections to paddle 10 and ground pin $V_{SS}$.

To minimize noise in the integrated circuit chip it is often helpful to connect a capacitor between the power and ground busses. With "on-chip" busses the aforesaid capacitor consumes additional chip area. With the arrangement of this invention that capacitor can be conveniently connected across the power and ground segments of the central support member near the beginning of the assembly of the package.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. A lead frame device comprising:
   a metal lead frame having a central support member and a plurality of leads extending from the vicinity of the central support member outward, a semiconductor chip supported directly by the central support member, conductive members attached from sites on the semiconductor chip to the plurality of leads, and a plastic material commonly encapsulating the semiconductor chip, the central support member, the conductive members, and a portion of each of the plurality of leads, leaving a portion of each of the leads extending beyond the plastic encapsulant,
   the invention characterized in that the central support member is segmented into at least two electrically separate portions at least one of which forms a crossunder and extends from beyond one edge of the chip to beyond an opposing edge of the chip, conductive members attached from the chip to each end of the crossunder portion, and insulating means electrically insulating the chip from the central support member.

2. The device of claim 1 further including a conductive layer interposed between the chip and the insulating means and a conductive member bonded between said conductive layer and the chip.

3. The device of claim 1 having a capacitor bonded across two segments of the central support member.

* * * * *